United States Patent
Shirasaki et al.

(10) Patent No.: US 8,394,557 B2
(45) Date of Patent: Mar. 12, 2013

(54) LITHOGRAPHIC PELLICLE

(75) Inventors: Toru Shirasaki, Annaka (JP); Kenichi Fukuda, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 137 days.

(21) Appl. No.: 12/949,426

(22) Filed: Nov. 18, 2010

(65) Prior Publication Data

US 2011/0129766 A1 Jun. 2, 2011

(30) Foreign Application Priority Data

Dec. 2, 2009 (JP) ................................ 2009-274283

(51) Int. Cl.
*G03F 1/64* (2012.01)
(52) U.S. Cl. ........................................... 430/4
(58) Field of Classification Search ............ 430/4–5; 428/14
See application file for complete search history.

(56) References Cited

U.S. PATENT DOCUMENTS

| | | | |
|---|---|---|---|
| 5,470,621 A | 11/1995 | Kashida et al. | |
| 5,834,143 A * | 11/1998 | Matsuoka et al. | 430/5 |
| 6,040,400 A | 3/2000 | Fukuda et al. | |
| 6,149,992 A | 11/2000 | Nakayama | |
| 2004/0137339 A1 | 7/2004 | Zhang et al. | |
| 2006/0263703 A1 | 11/2006 | Zhang et al. | |
| 2011/0129767 A1 * | 6/2011 | Shirasaki et al. | 430/5 |

FOREIGN PATENT DOCUMENTS

| | | |
|---|---|---|
| EP | 622680 A2 * | 11/1994 |
| EP | 0 877 292 A1 | 11/1998 |
| JP | 61-241756 | 10/1986 |
| JP | 2002-202587 | 7/2002 |
| JP | 2008-065258 | 3/2008 |

OTHER PUBLICATIONS

Search Report issued Mar. 28, 2011 in European Patent Application No. 10014845.1-1226.
Office Action issued Dec. 5, 2012, in Japanese Patent Application No. 2009-274283, filed Dec. 2, 2009.

* cited by examiner

*Primary Examiner* — Mark F Huff
*Assistant Examiner* — John S Ruggles
(74) *Attorney, Agent, or Firm* — Oblon, Spivak, McClelland, Maier & Neustadt, L.L.P.

(57) ABSTRACT

A lithographic pellicle comprises a pellicle film (1), a pellicle frame (3), and a PSA layer (4). The pellicle film (1) is stretched across and mounted to the pellicle frame (3) at its top end. The PSA layer (4) is disposed on the bottom end of the frame (3) and is capable of attaching the frame (3) to a substrate (5). An inner PSA layer (8) made of a curable composition comprising a perfluoro compound having a perfluoro structure backbone is disposed on the inner wall of the frame (3).

4 Claims, 2 Drawing Sheets

US 8,394,557 B2

LITHOGRAPHIC PELLICLE

CROSS-REFERENCE TO RELATED APPLICATION

This non-provisional application claims priority under 35 U.S.C. §119(a) on Patent Application No. 2009-274283 filed in Japan on Dec. 2, 2009, the entire contents of which are hereby incorporated by reference.

TECHNICAL FIELD

This invention relates to a lithographic pellicle for protecting a lithographic mask from dust or other debris during manufacture of semiconductor devices such as LSIs and VLSIs, and liquid crystal display panels.

BACKGROUND ART

The current LSI design rule reaches a finer size of the order of sub-quarter micron. Accordingly the light source for exposure becomes of a shorter wavelength. More particularly, the light source experiences a transition from g-line (436 nm) and i-line (365 nm) of a mercury lamp, which was the mainstream in the art, to KrF excimer laser (248 nm), ArF excimer laser (193 nm) or any shorter one.

In the manufacture of semiconductor devices (e.g., LSIs and VLSIs) and LC display panels, patterns are formed by exposing semiconductor wafers or LC glass substrates to light. The exposure step typically uses lithographic masks and reticles, which are collectively referred to as "exposure original plates", hereinafter. Problems arise if debris deposits on the exposure original plate. Since the debris absorbs or deflects light, the transferred pattern may be deformed or provided with rough edges, and the underlying layer may be contaminated black. These adversely impact the size, quality, and appearance of the pattern.

Although lithographic operations are typically performed in a clean room, it is still difficult to always maintain the exposure original plate clean. It is then a common practice to mount a pellicle on the surface of the exposure original plate for dust-proof protection before exposure is carried out. Then foreign particles do not deposit directly on the surface of the exposure original plate, but on the pellicle. The foreign particles on the pellicle do not contribute to the image transfer as long as the focus of lithographic projection is at the pattern on the exposure original plate.

The pellicle is generally constructed of a pellicle frame and a transparent pellicle film. The pellicle film is stretched across and mounted to the frame at its top end, and the frame at its bottom end is attached to an exposure original plate via a pressure-sensitive adhesive (PSA) layer. The pellicle film is formed of nitrocellulose, cellulose acetate, fluoropolymers and similar materials which are fully transmissive to exposure light, for example, g-line (436 nm) and i-line (365 nm) of a mercury lamp, KrF excimer laser (248 nm), and ArF excimer laser (193 nm). The pellicle film is mounted to the frame by applying a good solvent for the pellicle film to the top end of the pellicle frame, placing the pellicle film in contact with the top end, and air drying until a bond is formed, or by adhesively bonding the pellicle film to the top end of the frame using acrylic resin, epoxy resin or fluoro-resin base adhesives. Disposed on the bottom end of the pellicle frame is a PSA layer of polybutene resin, polyvinyl acetate resin, acrylic resin or silicone resin which is capable of attaching the frame to the exposure original plate. If necessary, a liner is attached to the PSA layer for the purpose of protecting the PSA layer.

On use of the pellicle, it is attached to the exposure original plate by forcing them under pressure with the PSA layer sandwiched therebetween, so that the pellicle may enclose the pattern region on the surface of the exposure original plate. The pellicle film, the pellicle frame and the exposure original plate define a closed pellicle space. Since the pellicle is provided for the purpose of preventing debris from depositing on the exposure original plate, the pattern region of the exposure original plate is isolated from the ambient atmosphere outside the pellicle so that dust in the ambient atmosphere may not deposit on the pattern surface. Since the pellicle is provided for the purpose of preventing foreign particles from depositing on the pattern of the exposure original plate, the surfaces of the pellicle defining the closed pellicle space, that is, the lower surface of the pellicle film and the inner wall surface of the pellicle frame must be kept free of foreign particles.

Typically foreign particles on the pellicle film can be detected having a size of down to about 0.3 µm. By contrast, on the inner wall surface of the pellicle frame, only foreign particles with a size of about 10 µm or larger can be detected. This means that even when a pellicle inspection detects no foreign particles on the frame inner wall, there can be present foreign particles with a size of less than 10 µm. Such foreign particles below the detectable level may fall on the exposure original plate during operation.

To avoid such spalling, the inner wall of the pellicle frame is provided with an inner PSA layer as disclosed in JP-A S61-241756. Even when foreign particles of undetectable size are present on the inner wall of the pellicle frame, the inner PSA layer on the inner wall of the pellicle frame holds the foreign particles adhered and prevents them from falling off the frame.

CITATION LIST

Patent Document 1: JP-A S61-241756
Patent Document 2: U.S. Pat. No. 6,040,400 (JP-A H11-116685)

DISCLOSURE OF INVENTION

Even so, particularly when the mask/pellicle for the ArF lithography is used over a long period, there may still arise a problem that solid foreign matter gradually precipitates on the pattern of the mask within the closed pellicle space to cause haze. Generally speaking, this problem is due to three causes. First is ion residues on the exposure original plate. Second is ionic and organic gases in the environment where the exposure original plate is used. Third is ions and organic gases released from the pellicle. These ions and organic gases undergo photo-reaction upon receipt of ArF excimer laser radiation, forming solid precipitates on the pattern.

Since the inner PSA layer on the pellicle frame inner wall is thin, only a minute amount of organic gases is released from the layer itself. Also, since the ArF excimer laser radiation is typically transmitted by the pattern region of the mask during use of the pellicle, no ArF excimer laser radiation impinges directly on the pellicle frame inner wall. However, it has recently been recognized that ArF excimer laser radiation is scattered at the edge of the pattern on the mask, and some scattering radiation impinges on the pellicle frame inner wall.

FIG. 3 schematically illustrates how ArF excimer laser radiation is scattered in a prior art lithographic pellicle. The pellicle includes a pellicle film 1 and a pellicle frame 3. The pellicle film 1 is stretched across pellicle frame 3 and bonded to the top end of pellicle frame 3 via an adhesive layer 2. The pellicle is attached to an exposure original plate 5 via a PSA layer 4 so that the pellicle may enclose a mask pattern 9 formed on the surface of exposure original plate 5. The inner wall of pellicle frame 3 is provided with an inner PSA layer 8. When ArF excimer laser radiation is incident on exposure original plate 5 as shown by the thick arrow, the majority of laser radiation is transmitted for transferring the pattern, for example, onto a semiconductor wafer (not shown). Part of laser radiation is scattered at the edge of mask pattern 9 on exposure original plate 5, with some scattering radiation moving toward pellicle frame 3. When scattering ArF excimer laser radiation impinges against inner PSA layer 8 on the inner wall of pellicle frame 3, the epoxy resin of which the inner PSA layer 8 is made (as disclosed in JP-A S61-241756), for example, is photo-decomposed to release gases. Such outgas undergoes photo-reaction by ArF excimer laser radiation within the pellicle closed space, causing solid precipitation or haze.

As ArF excimer laser radiation passes through the pellicle closed space, airborne oxygen within the pellicle closed space undergoes photo-reaction by ArF excimer laser radiation, producing ozone. Because of substantially no transfer of air into and out of the pellicle closed space, the ozone concentration increases within the pellicle closed space. As a result, the pellicle film, inner PSA layer and other components defining the pellicle closed space are exposed to ozone. Particularly when the inner PSA layer is made of a less weather resistant resin, for example, the resin is substantially degraded. Decomposition gas may be released when the resin is degraded, and the gas undergoes photo-reaction by ArF excimer laser radiation within the pellicle closed space, causing solid precipitation or haze.

Therefore, an object of the present invention is to provide a pellicle which is minimized in decomposition gas generation and haze generation even when ArF excimer laser radiation impinges against the inner PSA layer during long-term service.

The inventors have found that when a curable composition comprising a perfluoro compound having a perfluoro structure backbone is used as the adhesive in the inner PSA layer on the inner wall of the pellicle frame, the pellicle is minimized in decomposition gas generation and haze generation.

Accordingly, the invention provides a lithographic pellicle comprising a pellicle frame having a top end, a bottom end, and an inner wall, a pellicle film stretched across and mounted to the pellicle frame at its top end, a pressure-sensitive adhesive layer disposed on the bottom end of the frame, capable of attaching the frame to a substrate, and an inner pressure-sensitive adhesive layer disposed on the inner wall of the frame and made of a curable composition comprising a perfluoro compound having a perfluoro structure backbone in the cured state.

ADVANTAGEOUS EFFECTS OF INVENTION

Since a curable composition comprising a perfluoro compound having a perfluoro structure backbone is used as the PSA in the inner PSA layer on the inner wall of the pellicle frame, the pellicle is minimized in decomposition gas generation and haze generation even when ArF excimer laser radiation impinges against inner PSA layer during long-term service.

BRIEF DESCRIPTION OF DRAWINGS

These and other features, aspects, and advantages of the present invention will become better understood when the following detailed description is read with reference to the accompanying drawings in which like characters represent like parts throughout the drawings.

DESCRIPTION OF EMBODIMENTS

Unless defined otherwise, technical and scientific terms used herein have the same meaning as is commonly understood by one of skill in the art to which this invention belongs. The terms "a", "an" and "the" do not denote a limitation of quantity, but rather denote the presence of at least one of the referenced item. The terms "inner", "outer", "bottom", and/or "top", unless otherwise noted, are merely used for convenience of description, and are not limited to any one position or spatial orientation. The acronym "PSA" stands for pressure-sensitive adhesive.

The lithographic pellicle of the invention comprises a pellicle film, a pellicle frame, and a PSA layer. The pellicle film is stretched across and mounted to the pellicle frame at its top end. The PSA layer is disposed on the bottom end of the frame and is capable of attaching the frame to a substrate.

The components by which the pellicle is constructed are substantially the same as those of conventional pellicles, for example, pellicles for semiconductor lithography and pellicles for the manufacture of large-size LC display panels. They may be made of any well-known materials.

Figure 1:
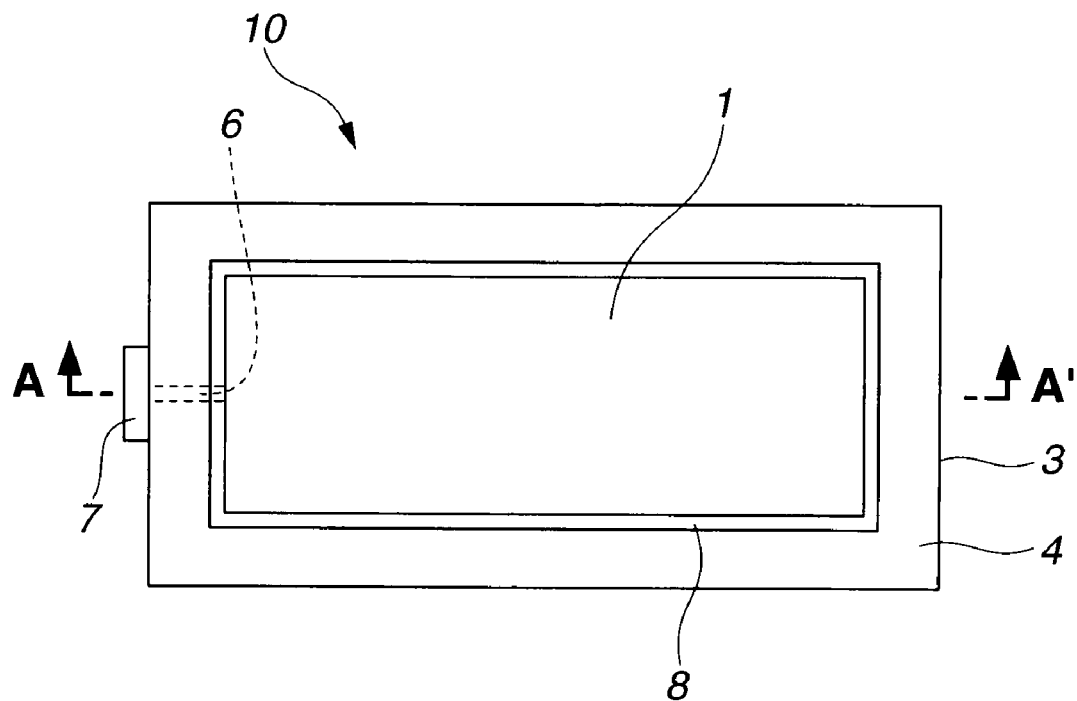
FIG. 1 is a bottom view of a lithographic pellicle in one embodiment of the invention.
Figure 2:
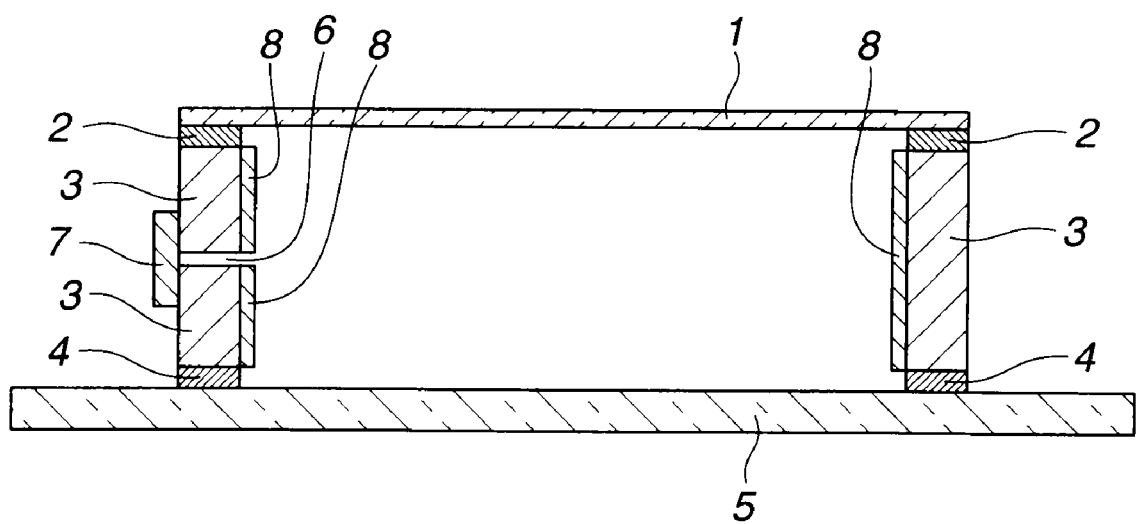
FIG. 2 is a cross-sectional view taken along lines A-A in FIG. 1, the pellicle being attached to an exposure original plate.
Figure 3:
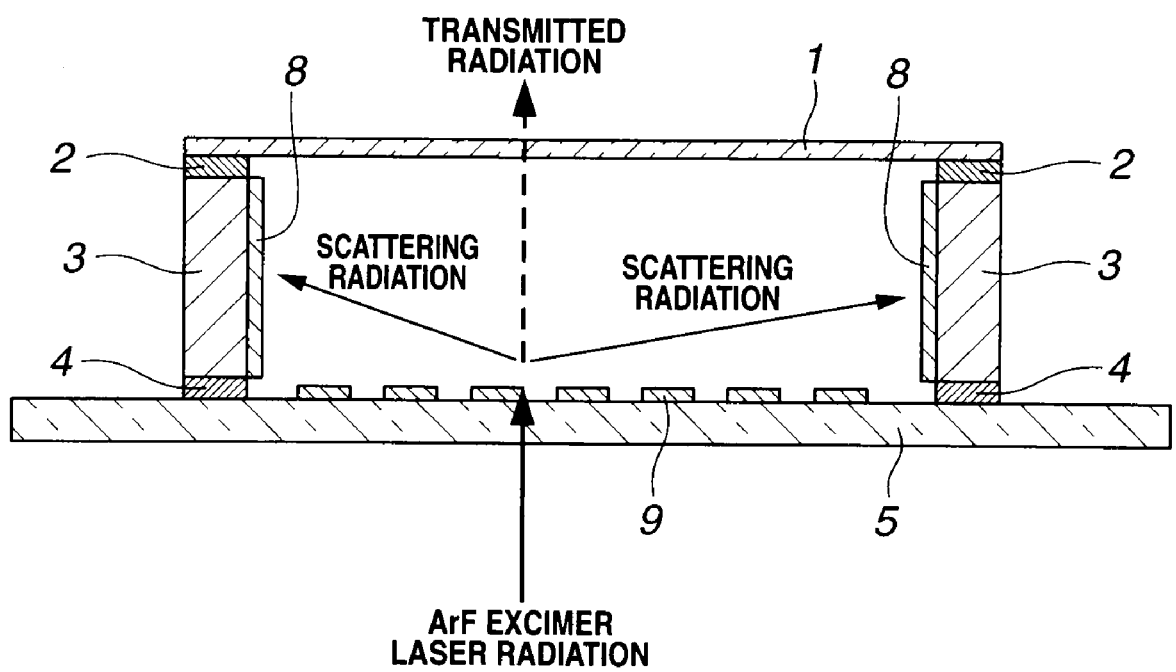
FIG. 3 schematically illustrates how ArF excimer laser radiation is scattered in a prior art lithographic pellicle.

Referring to FIG. 1, a lithographic pellicle in one embodiment of the invention is illustrated as viewed from the bottom. FIG. 2 is an elevational cross-sectional view taken along lines A-A in FIG. 1 when the pellicle is attached to an exposure original plate. A pellicle 10 includes a pellicle frame 3 of generally quadrangular shape, typically rectangular or square shape, corresponding to an exposure original plate 5 to which the pellicle 10 is attached. The pellicle frame 3 has a top end, a bottom end, an inner wall and an outer wall. A pellicle film 1 is stretched across and mounted to pellicle frame 3 at its top end via an adhesive layer 2.

The material of which pellicle film 1 is made is not particularly limited, and any well-known materials may be used. For example, amorphous fluoropolymers as commonly used in the excimer laser application may be employed. Examples of amorphous fluoropolymers include Cytop® from Asahi Glass Co., Ltd., and Teflon® from DuPont. If necessary, upon formation of pellicle films, these polymers may be dissolved in solvents, typically fluorinated solvents and used in solution form.

The adhesive layer 2 is not necessarily essential for bonding of pellicle film 1. Where the adhesive layer 2 is provided, the adhesive of which layer 2 is made is not particularly limited. Any well-known adhesives may be used, including acrylic adhesives, silicone adhesives, and fluorochemical adhesives, for example.

The material of which pellicle frame 3 is made is not particularly limited, and any well-known materials may be used. For example, aluminum alloys commonly used in the art, preferably aluminum alloys A7075, A6061, and A5052 according to the JIS nomination may be used. No particular limits are imposed on the aluminum alloy as long as it ensures a strength required for the pellicle frame.

The surface of pellicle frame 3 is preferably roughened by sand blasting, chemical polishing or the like, before the pellicle film and other components are mounted thereto. Any prior art well-known techniques may be employed for roughening the frame surface. When the pellicle frame is made of an aluminum alloy, for example, the aluminum alloy member may be surface roughened by blasting with stainless steel, silicon carbide, glass or other beads, and subsequent chemical polishing with NaOH or the like.

Disposed at the bottom end of pellicle frame 3 is a PSA layer 4 capable of attaching pellicle frame 3 to an exposure original plate 5 which is typically a mask or reticle. If necessary, a release liner (not shown) for protecting the PSA layer is applied to the lower surface of PSA layer 4.

For PSA layer 4, any suitable one may be chosen from a variety of PSAs including silicone, acrylic and polybutene base PSAs. Any well-known techniques may be used in applying the PSA in place.

The pellicle of the invention further includes an inner PSA layer disposed on the inner wall of the pellicle frame and made of a curable composition comprising a perfluoro compound having a perfluoro structure backbone. Specifically, as shown in FIGS. 1 and 2, an inner PSA layer 8 of tacky resin is disposed on the inner wall of pellicle frame 3.

The inner PSA layer 8 is made of any pressure-sensitive adhesives including fluorinated gel, rubber and resin compositions. Specifically, curable compositions comprising a perfluoro compound, typically a linear perfluoro compound, having a perfluoro structure backbone are used.

One typical perfluoro compound used herein is (A) a perfluoro compound having a perfluoroalkylene or perfluoropolyether structure in the backbone, preferably having at least 2, more preferably 2 alkenyl groups in the molecule, and also preferably a divalent linear perfluoroalkylene structure or divalent linear perfluoropolyether structure. Also useful is (B) a perfluoro compound having a perfluoroalkyl or perfluoropolyether structure in the backbone, preferably having one alkenyl group in the molecule, and also preferably a monovalent linear perfluoroalkyl structure or monovalent linear perfluoropolyether structure. Especially preferred is a curable composition containing both perfluoro compounds (A) and (B). The composition may further comprise a component capable of reaction or crosslinking with the alkenyl-containing perfluoro compound, specifically an organosilicon compound having at least two hydrosilyl groups (SiH groups) in the molecule, and a catalyst for this reaction, specifically platinum group metal catalysts such as platinum and platinum compounds.

As understood from the fact that fluoroplastics are used in the pellicle film, fluoropolymers are generally resistant to light of short wavelength, experience less photo-degradation, and release least decomposed products. The curable composition comprising a perfluoro compound having a perfluoro structure backbone is known from JP-A H11-116685, for example, and commercially available under the trade name of SIFEL® 8000 series from Shin-Etsu Chemical Co., Ltd.

Even in the case of fluoropolymers, it is difficult to control their decomposition completely. However, many decomposed products of fluoropolymers are less absorptive to light of short wavelength and undergo accordingly less reaction by ArF excimer laser radiation in the pellicle closed space, causing less haze. For this reason, the pellicle of the invention is advantageous particularly when ArF excimer laser radiation is used as the exposure light.

Any well-known methods may be employed in forming the PSA layer 8 on the pellicle frame inner wall. For example, a PSA liquid may be applied by brush or spray coating and cured by heating. If a PSA has too high a viscosity to coat, the PSA may be diluted with an organic solvent such as alcohol, water or the like to a lower viscosity sufficient to coat. The inner PSA layer is preferably formed on the entire surface of the pellicle frame inner wall. The composition may be cured under any well-known conditions.

The pellicle of the invention is preferably provided with at least one vent hole 6 in the side wall of pellicle frame for providing fluid communication between the interior and exterior of pellicle frame 3 for pressure balancing. A dust-proof filter 7 may be attached to the outer wall of the pellicle frame 3 so as to cover the hole 6 for the purpose of preventing entry of particles from without the pellicle. The dust-proof filter may be any well-known one. Although pellicle frame 3 is provided with only one vent hole 6 in FIGS. 1 and 2, there may be provided two or more vent holes.

EXAMPLE

Example and Comparative Example are given below by way of illustration and not by way of limitation. Although a "mask" is referred to in Examples as a typical example of "exposure original plate," the same structure is equally applicable to "reticle."

Example 1

A pellicle frame of aluminum alloy (outer dimensions: 149 mm×113 mm×4.5 mm, wall thickness: 2 mm) was cleaned with deionized water. The inner wall of the frame was coated with a 3% solution of a curable composition containing a linear perfluoro compound (trade name SIFEL 8070, Shin-Etsu Chemical Co., Ltd.) in a fluorochemical solvent (trade name NOVEC 7300, 3M-Sumitomo Co., Ltd.) by spray coating. After spraying, the coated frame was heated by electromagnetic induction heating for evaporating off the solvent and curing the coating. The heating schedule included heating from room temperature to 150° C. over 1 minute and holding at 150° C. for 5 minutes. This resulted in an inner PSA layer of 20 μm thick.

The bottom end of the pellicle frame was coated with a silicone PSA (trade name X-40-3122, Shin-Etsu Chemical Co., Ltd.). Immediately thereafter, the frame was heated to 180° C. by electromagnetic induction heating for evaporating off the solvent, resulting in a bottom PSA layer of 0.3 mm thick. The top end of the pellicle frame was coated with an adhesive Cytop® (trade name CTX-A, Asahi Glass Co., Ltd.), after which the frame was heated at 130° C. for curing the adhesive.

Thereafter, the pellicle frame at its top adhesive layer was brought in contact with a pellicle film of a fluoropolymer Cytop® (trade name CTX-S, Asahi Glass Co., Ltd.) stretched over an aluminum frame larger than the pellicle frame, after which a peripheral portion of the film outside the frame was removed, completing a pellicle.

The pellicle thus completed was attached to a mask having a pattern printed thereon. ArF excimer laser radiation (193 nm) was irradiated to the mask at the surface (lower in FIG. 2) opposite to the surface (upper in FIG. 2) on which the pellicle was attached. The ArF excimer laser had an oscillation frequency of 400 Hz and produced a radiation intensity of 0.05 mJ/cm$^2$/pulse and a total irradiation energy dose of 15,000 J/cm$^2$. The area of irradiation was 10×10 mm.

After irradiation, the pellicle was removed from the mask. The pattern surface of the mask exposed to ArF excimer laser radiation was observed under a scanning electron microscope (SEM), finding no growing foreign particles on the pattern surface.

Comparative Example 1

A pellicle frame of aluminum alloy (outer dimensions: 149 mm×113 mm×4.5 mm, wall thickness: 2 mm) was cleaned with deionized water. The inner wall of the frame was coated with a 3% solution of an acrylic PSA composition (trade name Corponeal 8694, Nippon Synthetic Chemical Industry Co., Ltd.) in toluene by spray coating. After spraying, the coated frame was heated by electromagnetic induction heating for evaporating off the solvent. The heating schedule included heating from room temperature to 100° C. over 1 minute and holding at 100° C. for 5 minutes. This resulted in an inner acrylic PSA layer of 20 µm thick.

The bottom end of the pellicle frame was coated with a silicone PSA (trade name X-40-3122, Shin-Etsu Chemical Co., Ltd.). Immediately thereafter, the frame was heated to 180° C. by electromagnetic induction heating for evaporating off the solvent, resulting in a bottom PSA layer of 0.3 mm thick. The top end of the pellicle frame was coated with an adhesive Cytop® (trade name CTX-A, Asahi Glass Co., Ltd.), after which the frame was heated at 130° C. for curing the adhesive.

Thereafter, the pellicle frame at its top adhesive layer was brought in contact with a pellicle film of a fluoropolymer Cytop® (trade name CTX-S, Asahi Glass Co., Ltd.) stretched over an aluminum frame larger than the pellicle frame, after which a peripheral portion of the film outside the frame was removed, completing a pellicle.

The pellicle thus completed was attached to a mask having a pattern printed thereon. ArF excimer laser radiation (193 nm) was irradiated to the mask at the surface opposite to the surface on which the pellicle was attached. The ArF excimer laser had an oscillation frequency of 400 Hz and produced a radiation intensity of 0.05 mJ/cm$^2$/pulse and a total irradiation energy dose of 15,000 J/cm$^2$. The area of irradiation was 10×10 mm.

After irradiation, the pellicle was removed from the mask. The pattern surface of the mask exposed to ArF excimer laser radiation was observed under SEM, finding growing foreign particles with an average particle size of 5 µm on the pattern surface.

Japanese Patent Application No. 2009-274283 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A lithographic pellicle, comprising
    a pellicle frame having a top end, a bottom end, and an inner wall,
    a pellicle film stretched across and mounted to said pellicle frame at its top end,
    a pressure-sensitive adhesive layer disposed on the bottom end of said pellicle frame, capable of attaching said pellicle frame to a substrate, and
    an inner pressure-sensitive adhesive layer disposed on the inner wall of said pellicle frame and made of a curable composition comprising a perfluoro compound having a perfluoro structure backbone in a cured state, wherein said curable composition comprises:
    (A) a perfluoro compound having a perfluoroalkylene or perfluoropolyether structure in the backbone, having at least 2 alkenyl groups in the molecule,
    (B) a perfluoro compound having a perfluoroalkyl or perfluoropolyether structure in the backbone, having one alkenyl group in the molecule,
    an organosilicon compound having at least two hydrosilyl groups (SiH groups) in the molecule, and
    a platinum group metal catalyst.

2. The lithographic pellicle of claim 1, wherein said perfluoro compound (A) comprises a divalent linear perfluoroalkylene structure or a divalent linear perfluoropolyether structure.

3. The lithographic pellicle of claim 1, wherein said perfluoro compound (B) comprises a monovalent linear perfluoroalkyl structure or a monovalent linear perfluoropolyether structure.

4. The lithographic pellicle of claim 1, wherein said pellicle is provided with at least one vent hole in the side wall of said pellicle frame and a dust-proof filter attached to the outer wall of said pellicle frame so as to cover the hole.

* * * * *